US009546674B1

(12) United States Patent
Chen et al.

(10) Patent No.: US 9,546,674 B1
(45) Date of Patent: Jan. 17, 2017

(54) INTERLOCKING DEVICE FOR A TRAY IN A SUPPORTING STRUCTURE

(71) Applicant: Quanta Computer Inc., Taoyuan (TW)

(72) Inventors: Chao-Jung Chen, Taoyuan (TW); Yaw-Tzorng Tsorng, Taoyuan (TW); Chi-Fu Chen, Taoyuan (TW); Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 14/833,535

(22) Filed: Aug. 24, 2015

(51) Int. Cl.
*F16B 2/18* (2006.01)
*F16B 1/00* (2006.01)
*F16B 2/02* (2006.01)

(52) U.S. Cl.
CPC . *F16B 1/00* (2013.01); *F16B 2/18* (2013.01); *F16B 2/02* (2013.01)

(58) Field of Classification Search
USPC .......... 248/221.11, 222.11, 222.13, 222.51,248/222.52, 223.41; 70/78, 81, 84–88; 292/95, 292/96, 98, 100, 240, 241, 242, 194, 195, 197, 292/200, 340; 16/412
See application file for complete search history.

(56) References Cited

U.S. PATENT DOCUMENTS

| 5,791,700 A * | 8/1998 | Biro ........................ E05C 9/043 292/36 |
| 5,927,771 A * | 7/1999 | Simon ..................... E05C 3/006 292/101 |
| 8,991,119 B1* | 3/2015 | Bracci ...................... E06B 9/02 49/394 |
| 2002/0145291 A1* | 10/2002 | Goldenberg ........ E05B 65/0841 292/241 |
| 2004/0108742 A1* | 6/2004 | Pringnitz ................... B60J 5/14 296/50 |
| 2005/0242592 A1* | 11/2005 | Watts .................. E05B 15/0205 292/95 |
| 2006/0254918 A1* | 11/2006 | Jackson .................... B01L 9/52 204/456 |

* cited by examiner

*Primary Examiner* — Alfred J Wujciak
(74) *Attorney, Agent, or Firm* — Nixon Peabody LLP

(57) ABSTRACT

The interlocking device for a tray in a supporting structure while enabling the tray to be removed from the supporting structure. The tray can include a device that engages with at least one engaging device in the supporting structure. The tray is inserted into the supporting structure using the guide or other engaging device. When the tray is fully inserted into the supporting structure, the tray can be secured to the supporting structure by the interlocking device. The interlocking device secures the tray to the supporting structure by a locking mechanism that selectively engages a first recess and a handle that selectively engages a second recess in the supporting structure. When the tray is to be removed from the supporting structure, the interlocking device disengages from the first and second recesses and enables the tray to be removed without interference of the tray and the supporting structure.

16 Claims, 7 Drawing Sheets

INTERLOCKING DEVICE FOR A TRAY IN A SUPPORTING STRUCTURE

TECHNICAL FIELD

Embodiments of the disclosure are generally related to an interlocking device. More specifically, embodiments of the disclosure are generally related to an interlocking device for a tray in a supporting structure.

BACKGROUND

A typical locking device for a tray in a supporting structure includes more than one locking device, for example a first locking device between the tray and the supporting structure, and a second locking device between the tray and the supporting structure. In the typical locking device, the first and second locking devices are not interconnected; the locking devices can be locked and unlocked separately. This arrangement can be troublesome for removal and/or installation if an operator does not lock or unlock both devices. For example, if the operator only locks the first locking device, the tray may not be as secure as when the second locking device is also locked, resulting in damage to the tray and components that may be mounted to the tray. Alternatively, if the operator only unlocks the first locking device and attempts to remove the tray, the tray may be damaged as the second locking device remains locked to the supporting structure. What is needed then is an interlocking device for a tray in a supporting structure that easily and completely disengages the tray when withdrawn by the operator, yet is secured by the interlocking device when the tray is inserted by the operator into the supporting structure.

SUMMARY

Some embodiments with this disclosure provide an interlocking device for a tray in a supporting structure. The interlocking device includes a handle, a cam connected to the handle through an axle, a lever rotatable about a pivot point that engages the cam at a first end, and a locking mechanism connected to a second end of the lever. The locking mechanism with a retractable pin and the handle selectively engage a first and second recess, respectively, due to the interconnection of the locking mechanism and the handle by the lever and the cam.

In an embodiment of the disclosure, the interlocking device for a tray in a supporting structure engages a first recess in a supporting structure with a locking mechanism. The locking mechanism is connected to a lever that selectively engages a cam connected to a handle through an axle that engages a second recess in the supporting structure. The lever of the interlocking device rotates about a pivot point on the tray, engaged by the cam. As the handle rotates the lever, engaged by the cam, selectively engages or disengages the locking mechanism of the interlocking device from the first recess in the supporting structure while also selectively engaging or disengaging from the second recess in the supporting structure.

In an embodiment of the disclosure, when the handle is in the locked position, the lever engaged by the cam locks the locking mechanism into the first recess in the supporting structure, and the handle is locked into the second recess in the supporting structure.

In an embodiment of the disclosure, when the handle is in the unlocked position, the lever engaged by the cam unlocks the locking mechanism from the first recess in the supporting structure, and the handle is unlocked from the second recess in the supporting structure.

In an embodiment of the disclosure, the interlocking device includes a retractable pin within the locking mechanism for selectively engaging the first recess of the supporting structure.

In an embodiment of the disclosure, the interlocking device includes a retractable pin on one side of the locking mechanism that retracts when the opposite side of the locking mechanism contacts the tray.

In an embodiment of the disclosure, the interlocking device includes a retractable pin on one side of the locking mechanism that extends when the opposite side of the locking mechanism does not contact the tray.

In an embodiment of the disclosure, the interlocking device includes a cam that selectively engages a first end of a lever, causing it to rotate about a pivot point.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
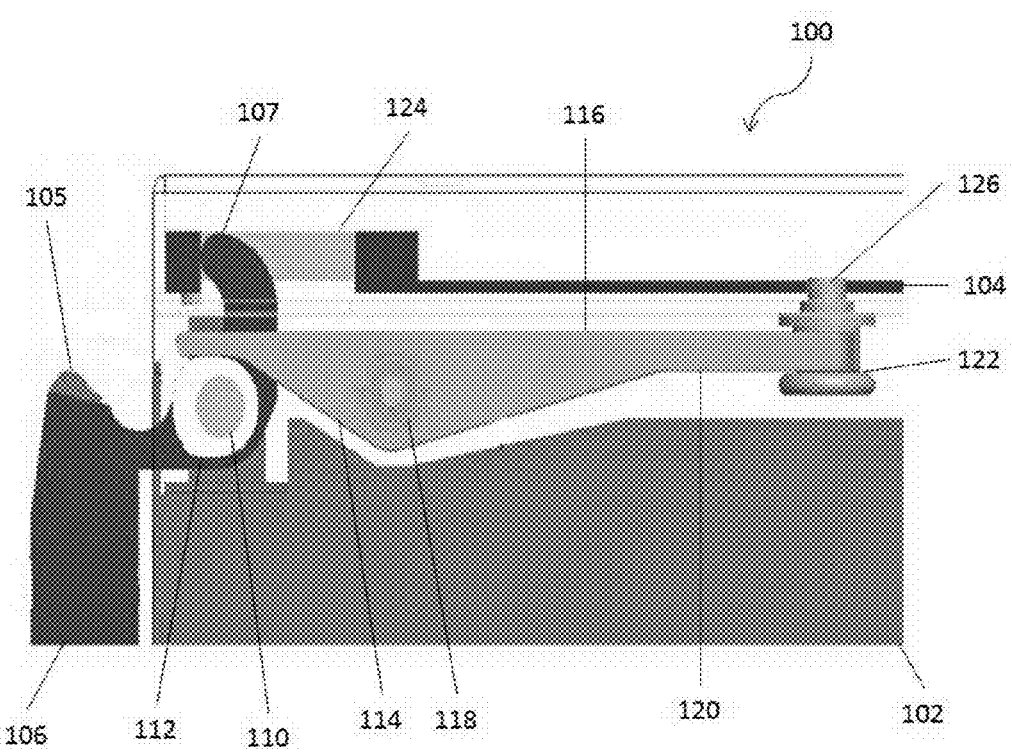
FIG. 1 is an exemplary diagram of an embodiment of the disclosure illustrating an interlocking device in a locked position.

In the following description, various embodiments will be illustrated by way of example and not by way of limitation in the figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Embodiments of the disclosure provide an interlocking device for a tray in a supporting structure. The interlocking device secures the tray to the supporting structure in at least two locations while enabling the tray to be removed from the supporting structure by unlocking from the at least two locations if desired. The tray is typically used as a base to mount a variety of components, such as but not limited to hard disk drives, network switches, power supplies, cooling fans, and other equipment. The tray can include a guide, track, rail, or other device that engages with at least one engaging device in the supporting structure. The tray is inserted into the supporting structure using the guide or other engaging device. When the tray is fully inserted into the supporting structure, the tray can be secured to the supporting structure by the interlocking device. The interlocking device secures the tray to the supporting structure by a locking mechanism that selectively engages a first recess and a handle that selectively engages a second recess in the supporting structure. When the tray is to be removed from the supporting structure, the interlocking device disengages from the first and second recesses and enables the tray to be removed from the supporting structure smoothly and without interference of the tray and/or the supporting structure.

To install a tray in the supporting structure, the tray is pushed into the supporting structure using a handle. As the handle contacts a supporting structure, the handle rotates about an axle, causing a cam connected to the handle to also rotate. The cam selectively engages a first end of a lever, causing the lever to rotate about a pivot point. The first end of the lever moves toward the supporting structure and a second end of the lever, including a locking mechanism, moves away from the supporting structure. As the cam rotates, the first end of the lever moves toward the tray and the second end of the lever moves toward the supporting structure. The locking mechanism that is connected to the second end of the lever loses contact with the tray. Once contact with the tray ends, a retractable pin of the locking mechanism extends upward toward the supporting structure. The handle continues to rotate about the axle, causing the handle to engage a second recess of the supporting structure, as the handle is used by an operator to push the tray into the supporting structure. The handle rotates into a locked position when the locking mechanism fully engages the first recess of the supporting structure and the handle fully engages the second recess of the supporting structure, locking the tray securely into the supporting structure in at least two locations.

To remove the tray from the supporting structure, the handle is rotated about the axle, driving the cam attached to the handle. The cam selectively engages the first end of the lever. As the cam rotates, the first end of the lever moves toward the supporting structure as the lever rotates about the pivot point. The second end of the lever, that includes the locking mechanism, disengages from the first recess in the supporting structure. As the handle rotates about the axle, the locking mechanism withdraws from the first recess in the supporting structure. The handle also disengages from the second recess in the supporting structure. The second end of the lever and the locking mechanism move away from the supporting structure and toward the tray until the locking mechanism contacts the tray. When the locking mechanism contacts the tray, the retractable pin of the locking mechanism retracts from the first recess in the supporting structure. The handle continues to rotate about the axle as it clears the second recess until it contacts the supporting structure. Once the handle contacts the supporting structure, the tray can be withdrawn from the supporting structure.

Referring now to FIGS. 1-7, an embodiment of the disclosure is shown. FIG. 1 is an illustration of an embodiment of an interlocking device 100 in a locked position securing a tray 102 to a supporting structure 104. The handle 106 is mounted to an axle 110 together with a cam 112 such that handle 106 and cam 112 rotate together. The cam 112 selectively contacts a first end 114 of a lever 116. The lever 116 is secured to the tray 102 by a pivot point 118, about which the lever 116 can rotate. The pivot point 118 may include a spring to bias the lever 116 against the cam 112.

At the second end 120 of the lever 116 is a locking mechanism 122 which engages a first recess 108 with a retractable pin 126 in the supporting structure 104. The locking mechanism 122 may be spring loaded to bias the locking mechanism 122 into the first recess 108 and to apply a resisting force against the lever 116. In this embodiment, the cam 112 is providing an engaging force on the first end 114 of the lever 116 that is conducted by the pivot point 118 to the second end 120, which forces the locking mechanism 122 and the retractable pin 126 into the first recess 108 of the supporting structure 104. A hook 107 of handle 106 engages the second recess 124 in the supporting structure 104, locking the tray to the supporting structure 104 in at least two locations.

Figure 2:
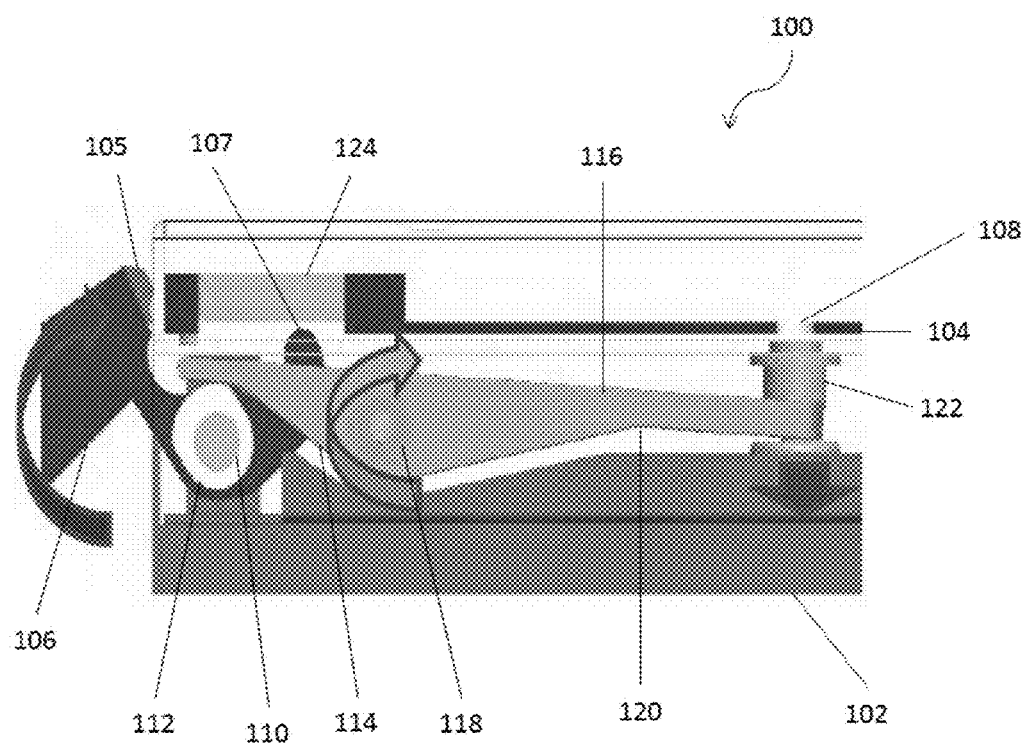
FIG. 2 is an exemplary diagram of an embodiment of the disclosure illustrating the interlocking device in an intermediate stage of unlocking and withdrawal.

FIG. 2 is an illustration of an embodiment of the interlocking device 100 transitioning from a locked state to an unlocked. The handle 106 is rotated (clockwise in this embodiment) from its previous position as shown in FIG. 1. As the handle 106 rotates about the axle 110, a hook 107 of the handle 106 disengages from the second recess 124 in the supporting structure 104. The cam 112 rotates with handle 106 about the axle 110 applies pressure against the first end 114 of the lever 116 to rotate about pivot point 118. The second end 120 of the lever 116 in turn rotates away from the supporting structure 104 and retracts retractable pin 126 from the first recess 108 of the supporting structure 104, thereby unlocking tray 102 from the supporting structure 104. The edge of try 102 may serve as a stop against further movement of pin 126, but this need not be the case as other types of stops may be provided, or omitted entirely.

Figure 3:
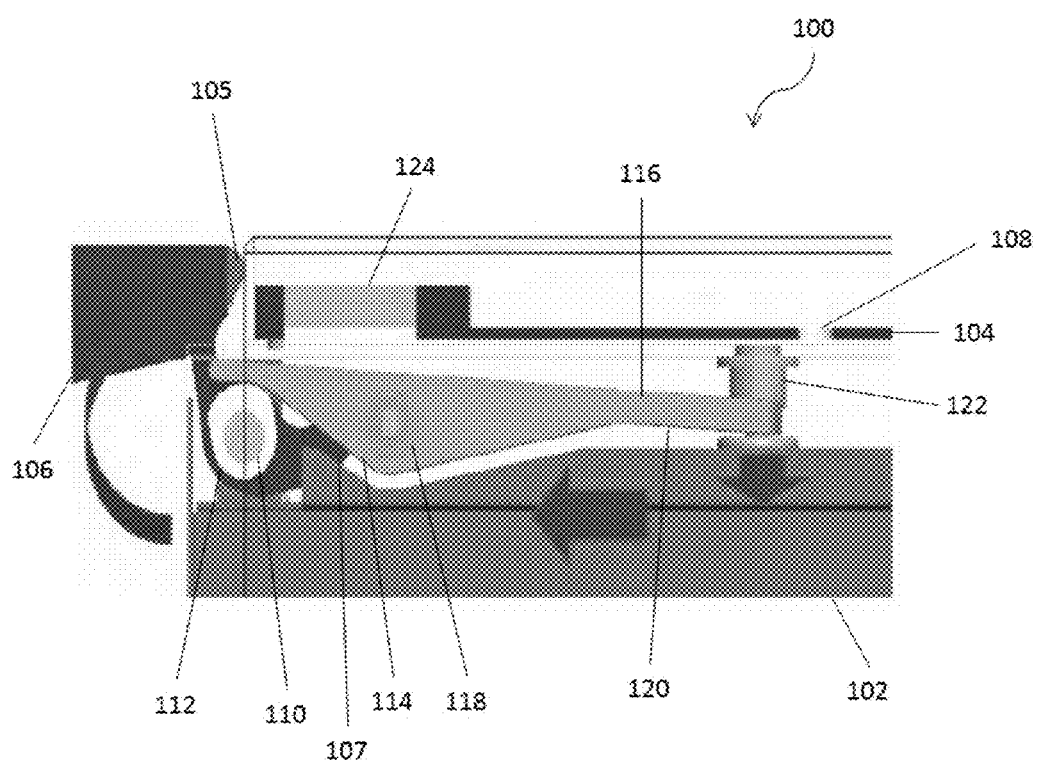
FIG. 3 is an exemplary diagram of an embodiment of the disclosure illustrating the interlocking device in an end stage of unlocking and withdrawal.

Referring now also to FIG. 3, when handle 106 rotates into the position of FIG. 2, a nub 105 of the handle 106 contacts the supporting structure 104. FIG. 3 is an illustration of an embodiment of the interlocking device 100 in an end stage of unlocking and withdrawal of the tray 102 from the supporting structure 104. In the transition from FIG. 2 to FIG. 3, continued rotation of handle 106 about the axle 110 fully disengages hook 107. The nub 105 acts a fulcrum, such that the rotational force on handle 106 is converted into linear movement of tray 102 out of the support structure 104 an into the position as shown in FIG. 3.

The lever 116 and cam 112 preferably have engaging shapes such that this continued rotation of handle 106 does not maintains the retracted state of and does not further retract pin 126 within the locking mechanism 122.

Figure 4:
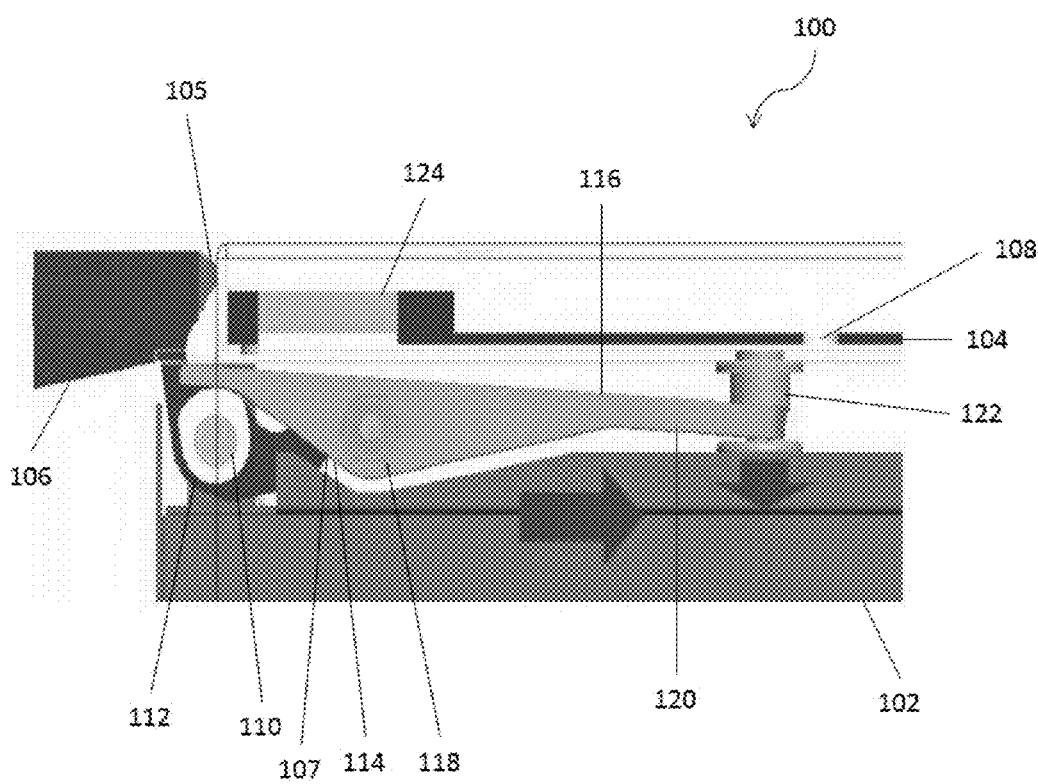
FIG. 4 is an exemplary diagram of an embodiment of the disclosure illustrating the interlocking device in a beginning insertion stage.

FIGS. 4-7 show the process or reinserting and relocking tray 102 into support structure 4. FIG. 4 is an illustration of an embodiment of the interlocking device 100 (re)inserting the tray 102 into the supporting structure 104 until the nub 105 meets the support structure 104. The components will be in the same position as in FIG. 3, and the tray could be withdrawn again from the position.

Figure 5:
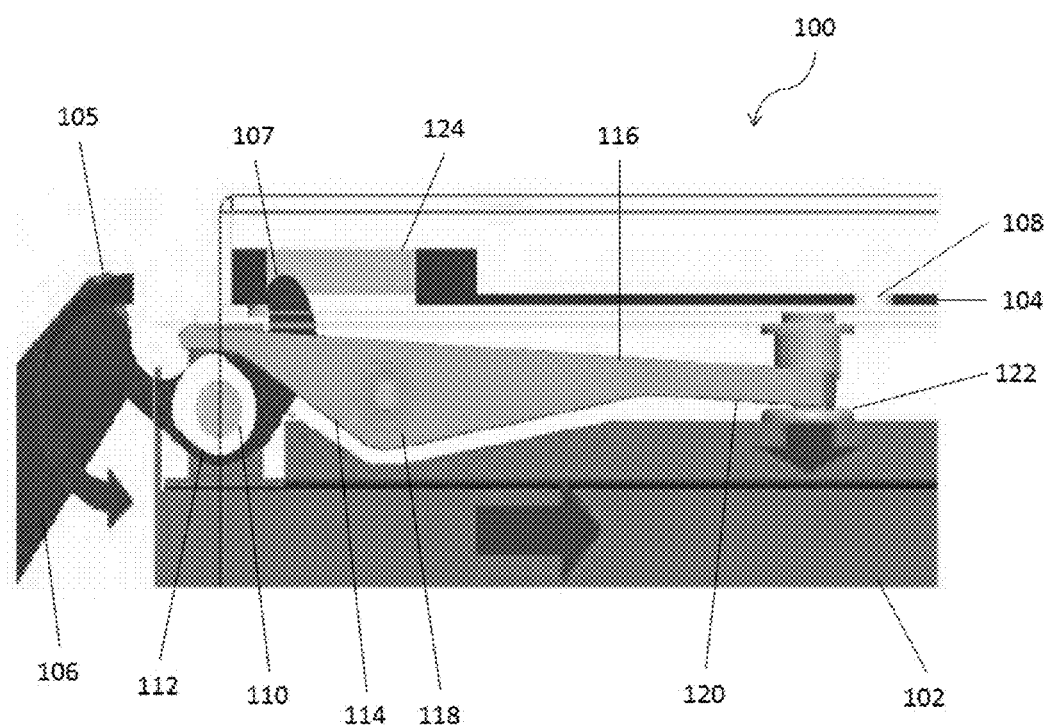
FIG. 5 is an exemplary diagram of an embodiment of the disclosure illustrating the interlocking device in an initial locking stage.

FIG. 5 is an illustration of an embodiment of the interlocking device 100 transitioning between the unlocked state and the locked state. In the transition from FIG. 4 to FIG. 5, the handle 106 is rotated (counterclockwise in this embodiment) about the axle 110 until the hook 107 abuts the second recess 124 in the supporting structure 104; further rotation of handle 106 causes the hook 107 to act as fulcrum, converting rotational movement of handle 106 into linear force that pushes the tray 102 into the supporting structure 104.

The cam 112 also rotates with the handle 106 on the axle 110 to turn away from the first end of lever 114. In FIG. 5 the cam 112 is still engaging the lever 116 and maintains the retractable pin 126 in the retracted position.

Figure 6:
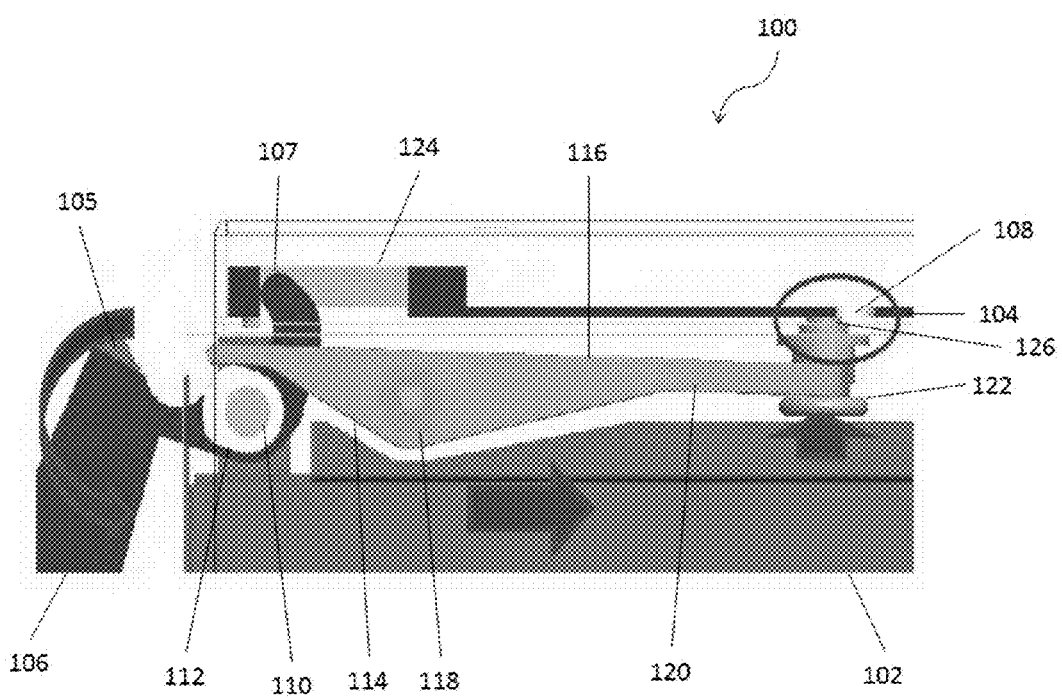
FIG. 6 is an exemplary diagram of an embodiment of the disclosure illustrating the interlocking device in an end state of locking.

FIG. 6 is an illustration of an embodiment of the interlocking device 100 near the end stage of the locking process. As the handle 106 continues to rotate (counterclockwise in this embodiment) about the axle 110 from FIG. 5 to FIG. 6, it drives tray 102 further into the supporting structure 104. The cam 112 also continues to rotate with the handle 106 on the axle 110, disengaging the first end 114 of the lever 116 and allowing the spring bias on retractable pin 126 to begin to move back toward its locking position. However, pin 126 cannot move fully into the locked position because it is not yet lined up with the first recess 108.

Figure 7:
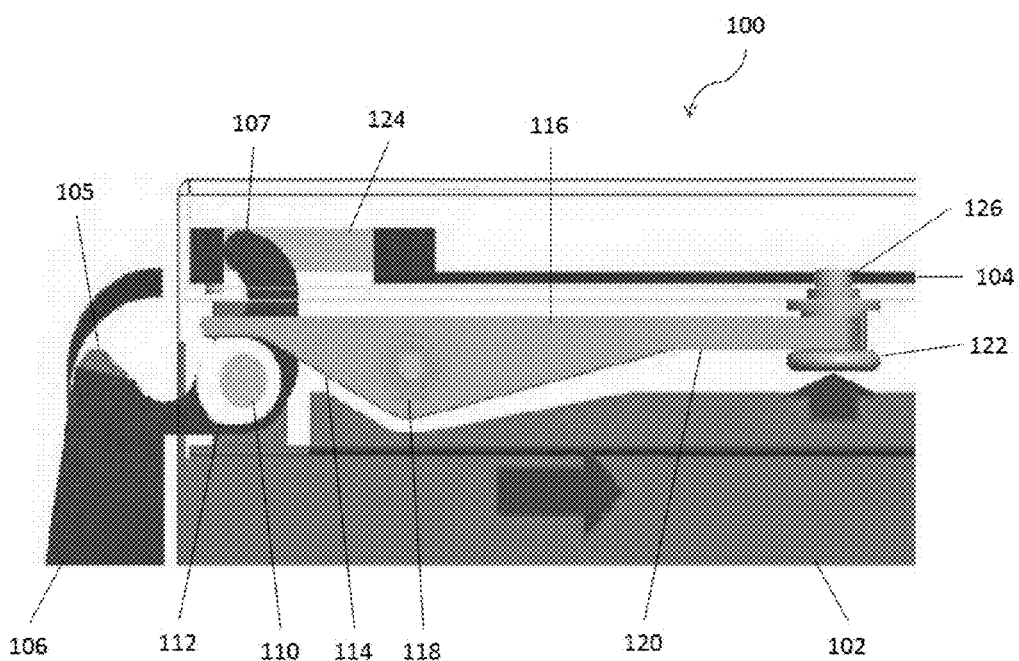
FIG. 7 is an exemplary diagram of an embodiment of the disclosure illustrating the interlocking device in a locked position.

FIG. 7 is an illustration of an embodiment of the interlocking device 100 at the end of the locking process. The handle 106 continues to rotate about the axle 110 to fully engage the second recess 124 in the supporting structure 104, locking the tray 102 into the supporting structure 104 as the handle 106 contacts the supporting structure 104. The retractable pin 126 extends into the first recess 108 once the retractable pin 126 is fully aligned with the first recess 108. The tray 102 is then secured to the supporting structure 104 in two locations: the retractable pin 126 engaging the first recess 108 and the handle 106 engaging the second recess 122. It should be understood that additional frictional elements may retain the tray 102 in the supporting structure 104, such as the engaging guides of the tray 102 and/or the supporting structure 104 as described above. Similarly, if the interlocking device is installed such that the tray 102 is parallel or substantially parallel to gravity, the tray 102 may slide out of this position with respect to the supporting structure 104. In this and other embodiments described herein, the tray 102 is substantially perpendicular to gravity.

For clarity and simplicity, only one interlocking device with a locking mechanism is described. However, multiple interlocking devices with multiple locking mechanisms can be supported by the above disclosure. For example, multiple interlocking devices with multiple locking mechanisms can be used to secure a variety of computer components to a variety of supporting structures in a variety of orientations.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature from being described. Also, the description is not to be considered as limiting the scope of the embodiments described herein. The drawings are not necessarily to scale and the proportions of certain parts have been exaggerated to better illustrate details and features of the present disclosure.

Although a variety of examples and other information were used to explain aspects within the scope of the appended claims, no limitation of the claims should be implied based on particular features or arrangements in such examples, as one of ordinary skill would be able to use these examples to derive a wide variety of implementations. For example, the fan cages can be secured on top of each other in multiple rows while also being secured to the fan tray according to the disclosure above. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and within the scope of the appended claims.

What is claimed is:

1. An interlocking device for a tray in a supporting structure, the device comprising:
    a handle rotatable about an axis, the handle being rotatable into at least a first handle position, a second handle position, and a third handle position;
    a cam connected to the handle such that the cam rotates with the handle;
    a lever rotatable about a pivot point, having a first end that selectively engages the cam and a second end opposite the first end;
    a locking member connected to the second end of the lever that selectively engages a first recess in the supporting structure;
    the locking member having a locked position where the locking member is engaged with the first recess and the handle is in a first handle position, such that the handle is locked into a support structure;
    wherein when the handle rotates about the axis from the first handle position to the second handle position, the cam rotates with the handle, rotation of the cam rotates the lever about the pivot point, and movement of the second end of the lever disengages the locking member from the supporting structure, thereby unlocking the tray from the supporting structure; and
    wherein when the handle further rotates about the axis from the second handle position to the third handle position, an edge of the handle engages the supporting structure and draws the tray out of the supporting structure.

2. The interlocking device of claim 1, wherein the locking member is spring loaded to bias the locking member into the first recess and to apply a resisting force to the second end of lever.

3. The interlocking device of claim 2, wherein the pivot point further comprises a spring to bias the lever against the cam.

4. The interlocking device of claim 1, wherein the handle has a hook configured to engage a second recess in the supporting structure.

5. The interlocking device of claim 4, wherein the hook contacts the second recess when the handle is rotated into the first position.

6. The interlocking device of claim 1, wherein the handle further comprises a nub that engages a surface of the supporting structure when drawing the tray from the supporting structure.

7. The interlocking device of claim 1, wherein the pivot point is mounted to the tray.

8. The interlocking device of claim 1, wherein the handle uses the hook as a fulcrum to drive the tray from the supporting structure.

9. The method of interlocking a tray in a supporting structure, the method comprising:
    rotating a handle about an axis, the handle being rotatable into at least a first handle position, a second handle position, and a third handle position;
    connecting the handle to a cam such that the came rotates with the handle;

rotating a lever about a pivot point, the lever having a first end that selectively engages the cam and a second end opposite the first end;

connecting a locking member to the second end of the lever that selectively engages a first recess in the supporting structure;

the locking member having a locked position where the locking member is engaged with the first recess and the handle is in a first handle position, such that the handle is locked into a support structure;

wherein when the handle rotates about the axis from the first handle position to the second handle position, the cam rotates with the handle, rotation of the cam rotates the lever about the pivot point, and movement of the second end of the lever disengages the locking member from the supporting structure, thereby unlocking the tray from the supporting structure; and wherein when the handle further rotates about the axis from the second handle position to the third handle position, an edge of the handle engages the supporting structure and draws the tray out of the supporting structure.

10. The method of claim 9, further comprising biasing the locking member using a spring into the first recess and applying a resisting force to the second end of the lever.

11. The method of claim 10, further comprising biasing the lever against the cam using a spring at the pivot point.

12. The method of claim 9, further comprising engaging a second recess in the supporting structure with a hook.

13. The method of claim 12, further comprising contacting the second recess with the hook when rotating the handle into the first position.

14. The method of claim 9, further comprising engaging a surface of the supporting structure with a nub when drawing the tray from the supporting structure.

15. The method of claim 9, further comprising mounting the pivot point to the tray.

16. The method of claim 9, further comprising using the hook of the handle as a fulcrum to drive the tray from the supporting structure.

* * * * *